United States Patent
Shin et al.

(10) Patent No.: US 7,354,835 B2
(45) Date of Patent: Apr. 8, 2008

(54) METHOD OF FABRICATING CMOS TRANSISTOR AND CMOS TRANSISTOR FABRICATED THEREBY

(75) Inventors: Dong-suk Shin, Yongin-si (KR); Hwa-sung Rhee, Seongnam-si (KR); Ueno Tetsuji, Suwon-si (KR); Ho Lee, Cheonan-si (KR); Seung-hwan Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 372 days.

(21) Appl. No.: 11/157,521

(22) Filed: Jun. 21, 2005

(65) Prior Publication Data

US 2005/0280098 A1    Dec. 22, 2005

(30) Foreign Application Priority Data

Jun. 22, 2004  (KR) .................. 10-2004-0046621

(51) Int. Cl.
  *H01L 21/336* (2006.01)
(52) U.S. Cl. ............... 438/300; 438/199; 257/E21.092; 257/E21.431
(58) Field of Classification Search ................ 438/199, 438/300; 257/E21.041, E21.092, E21.316, 257/E21.412, E21.428, E21.429, E21.43, 257/E21.431
  See application file for complete search history.

(56) References Cited

U.S. PATENT DOCUMENTS

| | | | | |
|---|---|---|---|---|
| 5,834,810 | A * | 11/1998 | Schunke et al. | 257/336 |
| 6,605,498 | B1 | 8/2003 | Murthy et al. | 438/197 |
| 6,987,061 | B2 * | 1/2006 | Mehrotra | 438/682 |
| 7,045,407 | B2 * | 5/2006 | Keating et al. | 438/198 |
| 7,078,285 | B1 * | 7/2006 | Suenaga | 438/199 |
| 7,118,952 | B2 * | 10/2006 | Chen et al. | 438/199 |

(Continued)

FOREIGN PATENT DOCUMENTS

KR    2002-0066191    8/2002

OTHER PUBLICATIONS

Chang, G. K. "Selective Etching of SiGe on SiGe/Si Heterostructures" Journal of the Electrochemical Soc. vol. 138 No. 1 Jan. 1991 p. 202-204.*

(Continued)

*Primary Examiner*—Michael Lebentritt
*Assistant Examiner*—Grant S Withers
(74) *Attorney, Agent, or Firm*—Mills & Onello LLP

(57) ABSTRACT

In a method of fabricating a CMOS transistor, and a CMOS transistor fabricated according to the method, the characteristics of first and second conductivity type MOS transistors are both simultaneously improved. At the same time, the fabrication process is simplified by reducing the number of masks required. The method includes amorphizing the active region of only the second conductivity type MOS transistor, and performing selective etching to form a first recessed region of a first depth in the active region of the first conductivity type MOS transistor and a second recessed region of a second depth that is greater than the first depth in the active region of the second conductivity type MOS transistor. Selective epitaxial growth is performed in the first and second recessed regions to form an elevated epitaxial layer that fills the first recessed region and extends to a level that is above the upper surface of the semiconductor substrate and to form a recessed epitaxial layer that fills the second recessed region.

16 Claims, 7 Drawing Sheets

U.S. PATENT DOCUMENTS

| | | | |
|---|---|---|---|
| 7,151,034 B2 * | 12/2006 | Lee et al. | 438/300 |
| 7,166,897 B2 * | 1/2007 | Orlowski et al. | 257/396 |
| 7,195,985 B2 * | 3/2007 | Murthy et al. | 438/341 |
| 7,262,472 B2 * | 8/2007 | Pidin | 257/410 |
| 7,288,448 B2 * | 10/2007 | Orlowski et al. | 438/198 |
| 2002/0109135 A1 | 8/2002 | Murota et al. | 257/20 |
| 2003/0080361 A1 * | 5/2003 | Murthy et al. | 257/288 |
| 2005/0164450 A1 * | 7/2005 | Fang et al. | 438/257 |
| 2005/0287752 A1 * | 12/2005 | Nouri et al. | 438/303 |
| 2006/0088968 A1 * | 4/2006 | Shin et al. | 438/299 |
| 2006/0166492 A1 * | 7/2006 | Orlowski et al. | 438/637 |
| 2007/0099369 A1 * | 5/2007 | Ning | 438/199 |

OTHER PUBLICATIONS

Welser, J., et al. "Strain Dependence of the Performance Enhancement in Strained-Si $n$-MOSFETs." IEDM Tech. Dig. 1994, p. 373.

Rim, K., et al. "Enhanced Hole Mobilities in Surface-channel Strained-Si $p$-MOSFETs." IEDM Tech. Dig. 1995, p. 517.

* cited by examiner

METHOD OF FABRICATING CMOS TRANSISTOR AND CMOS TRANSISTOR FABRICATED THEREBY

RELATED APPLICATIONS

This application claims priority to Korean Patent Application No. 10-2004-0046621 filed on Jun. 22, 2004 in the Korean Intellectual Property Office, the disclosure of which is incorporated herein by reference in its entirety.

BACKGROUND OF THE INVENTION

1. Field of the Invention

The present invention relates to a method of fabricating a complementary metal oxide-semiconductor (CMOS) transistor and a CMOS transistor fabricated by the method, and more particularly, to a method of fabricating a CMOS transistor, by which the characteristics of both first and second conductivity type MOS transistors are improved, while simplifying the fabrication process by using a fewer number of masks, and a CMOS transistor fabricated according to the method.

2. Description of the Related Art

As semiconductor devices continue to operate at faster operation speeds and continue to become more highly integrated, various methods for fabricating semiconductor devices with improved characteristics using existing fabrication technology have been proposed to overcome the challenges associated with ever-smaller features. In particular, there has been extensive study in the field of improving electron or hole mobility using a strain effect in a channel portion of a semiconductor device so as to embody a high performance semiconductor device, as disclosed by J. Welser et al. in "Strain Dependence of the Performance Enhancement in Strained-Si n-MOSFETs," IEDM Tech. Dig. 1994, p 373 and by K. Rim et al. in "Enhance Hole Mobilities in Surface-Channel Strained-Si p-MOSFETs," IEDM Tech. Dig. 1995, p. 517.

In a typical method for increasing electron or hole mobility as described above, a strained layer is used. If a semiconductor material such as Si or C is implanted into a source/drain region, a tensile stress is created in an X-direction, and thus a tensile-strained layer is formed in a channel region. For this reason, effective mass in the channel region is reduced and electron mobility is increased in turn. On the other hand, if a semiconductor material such as Ge is implanted into the source/drain region, a compressive stress is created in the X-direction so that a compressive-strained layer is formed in the channel region. For this reason, effective mass in the channel region is increased and hole mobility is increased in turn.

In one method of providing a tensile stress or a compressive stress in a channel region portion, materials having different lattice constants are provided in the source/drain region. Such a method is referred to as a heterogeneous epitaxial growth method and there are various methods used to accomplish such growth.

For example, a lattice constant of Si is 5.43 Å and Ge has the same diamond structure as Si and a lattice constant of 5.66 Å which is larger than that of Si. Further, SiGe has the same diamond structure as Si and a lattice constant larger than that of Si and smaller than that of Ge according to the concentration ratio of Ge contained in the Si. For this reason, in a case of growing Si on an upper part of a Si1-xGex layer using the heterogeneous epitaxial growth method, a phenomenon in which a lattice of Si is increased and a lattice of SiGe is reduced is generated so as to identify the lattice of Si with the lattice of SiGe. A method of increasing electron or hole mobility using such a phenomenon has been widely used.

Further, examples of the method of increasing electron or hole mobility include a method of using a strain effect along the entire surface of a substrate and a method of using a local strain effect in a particular portion of a device.

A method of utilizing a local strain effect is disclosed in U.S. Pat. No. 6,605,498 issued on Aug. 12, 2003. The above patent discloses that a lower part of a gate electrode is recessed and then the recessed region is filled with SiGe as a channel material in a case of a p-channel MOS (PMOS) transistor or filled with SiC as a channel material in a case of an N-channel MOS (NMOS) transistor using a selective epitaxial growth method. In the case of utilizing the local strain effect, since Si and SiGe or SiC have different lattice constants, a compressive stress is created in a channel portion of Si in a case of the PMOS transistor and a tensile stress is created in a case of the NMOS transistor. This increases electron or hole mobility in each of the channel portions, thereby making it possible to improve the characteristics of the resulting semiconductor device.

However, in the aforementioned method, it is impossible to fill the recessed region with the channel material after recessing the lower parts of the gate electrodes of the NMOS transistor and the PMOS transistor at the same time. The reason is that the strain required for each of the channel portions for improving the characteristic of the semiconductor device are reversed. For this reason, in the above patent, after recessing only the lower parts of the gate electrodes of the PMOS transistor, a SiGe layer is formed within the recessed region using the selective epitaxial growth method. At this time, a separate mask process is required for preventing the lower parts of the gate electrodes of the NMOS transistor from being recessed.

SUMMARY OF THE INVENTION

To address the above-described limitations, it is an object of the present invention to provide a method of fabricating a CMOS transistor which improves characteristics of both first and second conductivity type MOS transistors at the same time, while limiting the number of fabrications masks required.

It is another object of the present invention to provide a CMOS transistor which improves characteristics of both first and second conductivity type MOS transistors at the same time.

In one aspect, the present invention is directed to a method of fabricating a CMOS transistor comprising: (a) providing a semiconductor substrate including active regions of first and second conductivity type MOS transistors respectively; (b) respectively forming gate insulating layers and gate electrodes of the first and second conductivity type MOS transistors on each of the active regions; (c) implanting first conductivity type impurity ions into the active region of the first conductivity type MOS transistor using the gate electrode of the first conductivity type MOS transistor as an ion implantation mask, and implanting second conductivity type impurity ions and amorphous ions into the active region of the second conductivity type MOS transistor using the gate electrode of the second conductivity type MOS transistor as an ion implantation mask to amorphize the active region of the second conductivity type MOS transistor; (d) forming spacers at sidewalls of the gate electrodes; (e) etching the active regions exposed by the gate electrodes and the spacers to form a first recessed region of a first depth in the active region of the first conductivity type MOS transistor and a second recessed region of a second depth in the active region of the second conductivity type MOS transistor, the second depth being greater than the first depth; (f) performing selective epitaxial growth on the first and second recessed regions to form an elevated epitaxial layer filling the first recessed region and extending to a level above an upper surface of the semiconductor substrate and to form a recessed epitaxial layer that fills the second recessed region; and (g) respectively forming first and second conductivity type junction regions in the elevated epitaxial layer and the recessed epitaxial layer.

In one embodiment, the amorphous ions are selected from Ge, Si, P, In, and a combination thereof.

In another embodiment, step (c) is performed using an etch gas which can selectively etch the amorphized active region of the second conductivity type MOS transistor, into which the second conductivity type impurity ions are implanted, rather than the active region of the first conductivity type MOS transistor, into which the first conductivity type impurity ions are implanted. In another embodiment, the etch gas is a halogenized gas.

In another embodiment, in step (c), a depth ratio of the first recessed region to the second recessed region is 1-50 to 10-200.

In another embodiment, the elevated epitaxial layer includes a first epitaxial layer filling the first recessed region and a second epitaxial layer which is formed on the first epitaxial layer and extends above an upper surface of the semiconductor substrate, and wherein the recessed epitaxial layer includes a first epitaxial layer filling a portion of the second recessed region and a second epitaxial layer formed thereon filling a remainder of the recessed region. In another embodiment, the first epitaxial layers are formed of a semiconductor material or a semiconductor material containing an additive different from those forming the second epitaxial layers. In another embodiment, the semiconductor material is Si and the additive is a material having a lattice constant different from that of the semiconductor material. In another embodiment, the additive is Ge or C. In another embodiment, the first epitaxial layer is formed of Si or SiC and the second epitaxial layer is formed of SiGe. In another embodiment, the first epitaxial layer is formed of SiGe and the second epitaxial layer is formed of Si or SiC.

In another embodiment, step (b) comprises: successively forming the gate insulating layer, a conductive layer for the gate electrode and an insulating layer for a hard mask on the semiconductor substrate; patterning the insulating layer to form the hard mask; and etching the conductive layer for the gate electrode and the gate insulating layer using the hard mask as an etch mask to form the gate electrodes and the patterned gate insulating layer.

In another embodiment, the method further comprises prior to step (d), implanting halo ions into the active regions of the first and second conductivity type MOS transistors.

In another embodiment, the method further comprises prior to step (g), providing a silicide layer for forming contacts. In another embodiment, the silicide layer is formed using Ni when the second epitaxial layer is formed of SiGe.

In another aspect, the present invention is directed to a CMOS transistor comprising: a semiconductor substrate; a first conductivity type MOS transistor which includes a gate insulating layer and a gate electrode stacked on the semiconductor substrate, and elevated source and drain regions which abut a channel region in the semiconductor substrate below the gate insulating layer and which are formed by elevated epitaxial layers, each including a first epitaxial layer formed in a first recess of the semiconductor substrate and a second epitaxial layer formed on the first epitaxial layer and extending to a level that is above an upper surface of the semiconductor substrate; and a second conductivity type MOS transistor which includes a gate insulating layer and a gate electrode stacked on the semiconductor substrate, and recessed source and drain regions which abut a channel region in the semiconductor substrate below the gate insulating layer and which are formed by recessed epitaxial layers, each including a first epitaxial layer formed in a second recess of the semiconductor substrate and a second epitaxial layer formed in the second recess on the first epitaxial layer; wherein the gate electrode of the first conductivity type MOS transistor is electrically connected to the gate electrode of the second conductivity type MOS transistor; and one of the source and drain regions of the first conductivity type MOS transistor is electrically connected to a corresponding one of the source and drain regions of the second conductivity type MOS transistor.

In one embodiment, the first epitaxial layers are formed of a semiconductor material or a semiconductor material containing an additive different from those forming the second epitaxial layers. In another embodiment, the semiconductor material is Si and the additive is a material having a lattice constant different from that of the semiconductor material. In another embodiment the additive is Ge or C. In another embodiment the first epitaxial layer is formed of Si or SiC and the second epitaxial layer is formed of SiGe. In another embodiment, the first epitaxial layer is formed of SiGe and the second epitaxial layer is formed of Si or SiC. In another embodiment, the second recess is of a depth relative to an upper surface of the semiconductor substrate that is greater than a depth of the first recess.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
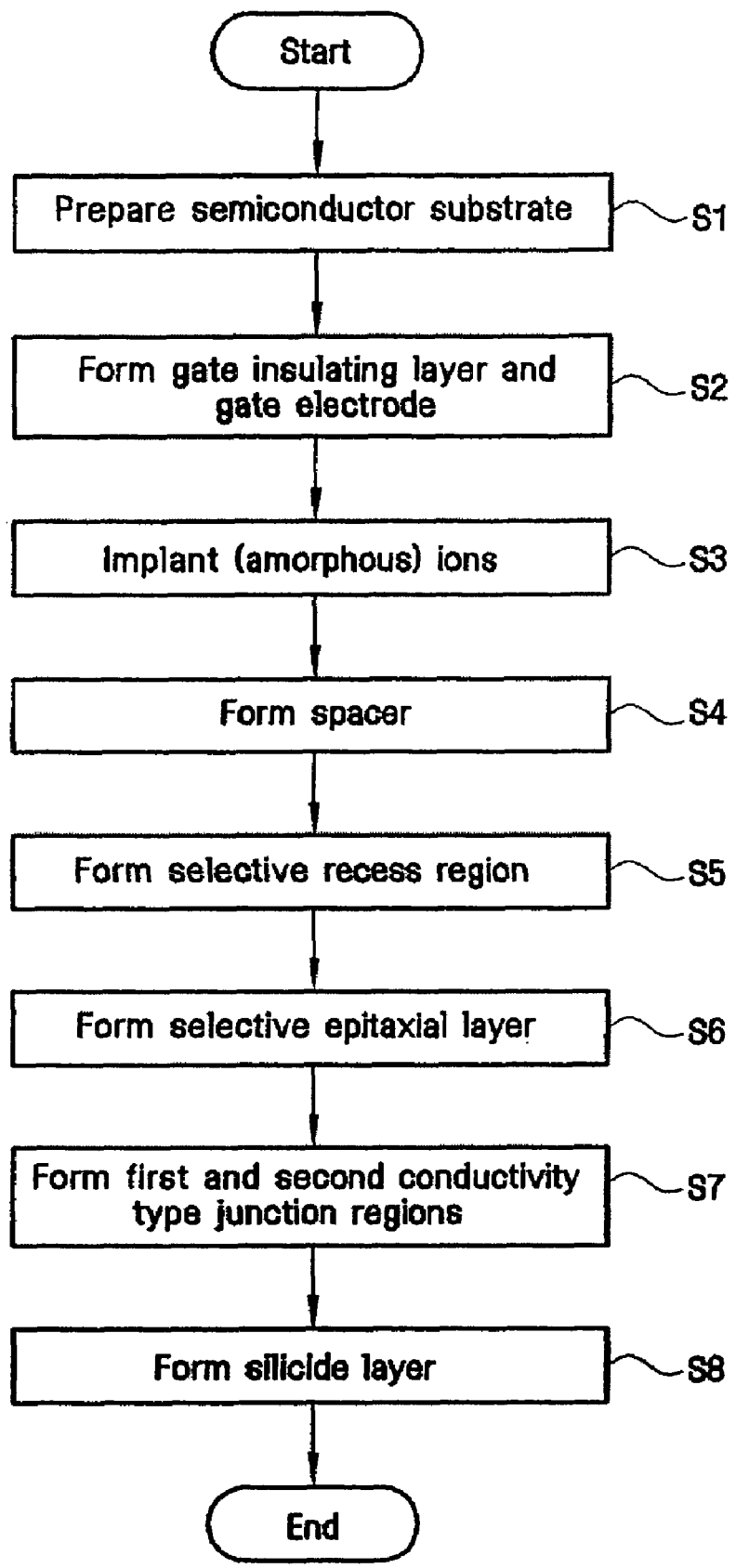
FIG. 1 is a flow diagram of a method of fabricating a CMOS transistor according to one embodiment of the present invention.

Advantages and features of the present invention and methods of accomplishing the same are readily understood with reference to the following detailed description of preferred embodiments and the accompanying drawings. The present invention can, however, be embodied in many different forms and should not be construed as being limited to the embodiments set forth herein. Rather, these embodiments are provided so that this disclosure will be thorough and complete and will fully convey the invention to those skilled in the art. Like reference numerals refer to like elements throughout the specification.

Hereinafter, a method of fabricating a CMOS transistor according to one embodiment of the present invention is described. FIG. 1 is a flow diagram of a method of fabricating a CMOS transistor according to one embodiment of the present invention, and FIGS. 2 to 10 are cross-sectional views successively illustrating the method of fabricating the CMOS transistor according to one embodiment of the present invention.

Referring to FIG. 1, a semiconductor substrate respectively having active regions of first and second conductivity type MOS transistors is prepared in step S1.

Figure 2:
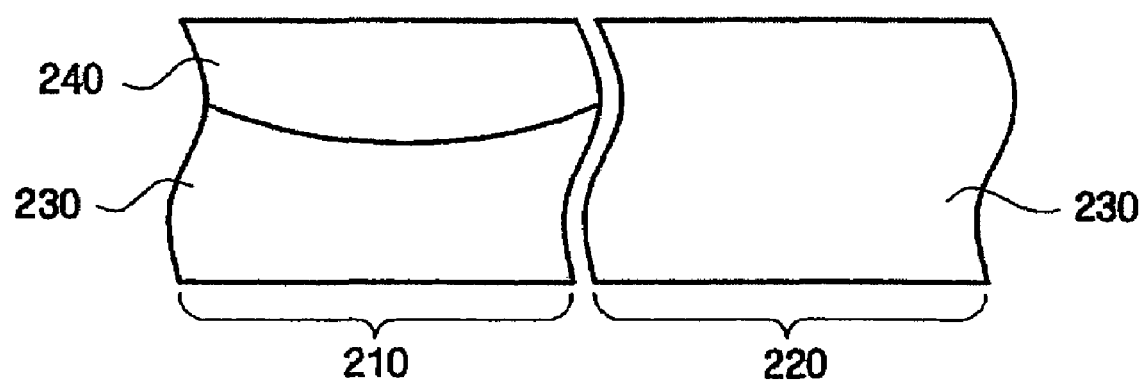
FIGS. 2 to 10 are cross-sectional views successively illustrating a method of fabricating the CMOS transistor according to one embodiment of the present invention.

Specifically, a semiconductor substrate 230 is prepared in reference to FIG. 2.

As the semiconductor substrate 230, all kinds of substrates can be used, which are made of materials other than a Si substrate and a silicon on insulator (SOI) substrate and which can utilize a selective epitaxial growth method. As shown in FIG. 2, a second conductivity type well 240 can be formed on an active region 210 of a first conductivity type MOS transistor. Of course, on occasion, a first conductivity type well can be formed on an active region 220 of a second conductivity type MOS transistor and the second conductivity type well 240 can be formed on the active region 210 of the first conductivity type MOS transistor. Hereinafter, as shown in FIG. 2, the following explanation will use as an example a case where the second conductivity type well 240 is formed on the active region 210 of the first conductivity type MOS transistor.

Further, the active region 210 of the first conductivity type MOS transistor and the active region 220 of the second conductivity type MOS transistor can be defined by a field isolation layer (not shown). The field isolation layer isolates adjacent transistors. The field isolation layer may, for example, be a shallow trench isolation (STI) layer formed by etching a trench into the semiconductor substrate 230.

Subsequently, a gate insulating layer and a gate electrode are formed in step S2.

Figure 3:
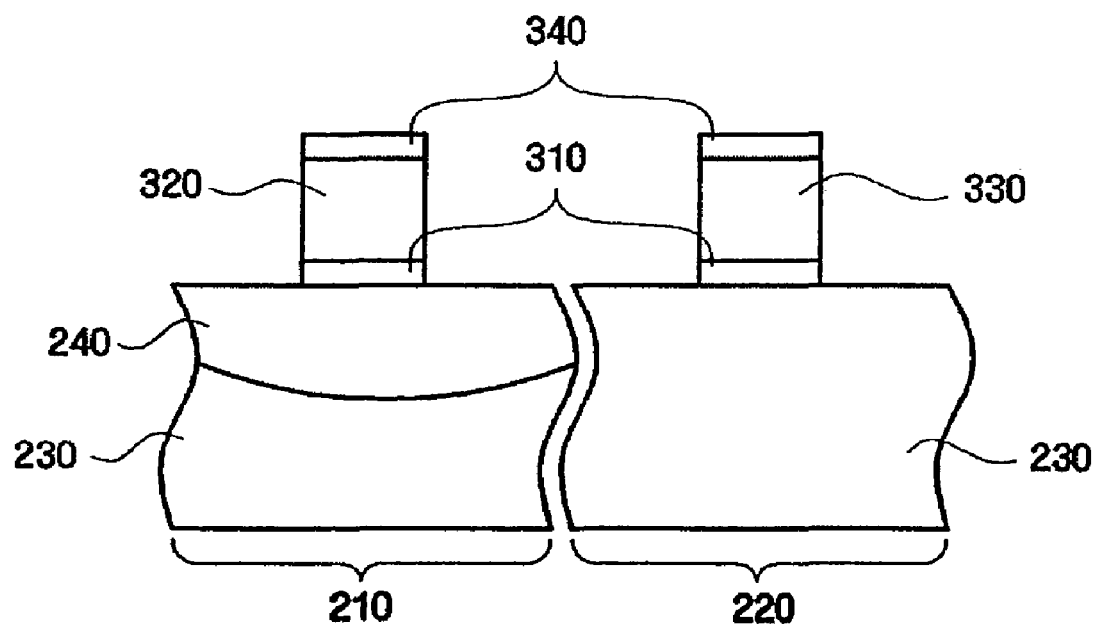

Referring to FIG. 3, gate insulating layers 310 are formed on the active regions 210 and 220 of the first and second conductivity type MOS transistors of the semiconductor substrate 230. The gate insulating layers 310 are deposited for example using a material selected among $SiO_2$, SiON, SiN and $Al_2O_3$ or a material consisting of a combination thereof, and are formed to a thickness of 5-30 Å, preferably, about 8 Å.

Subsequently, conductive layers for a gate electrode are deposited on the resulting structure including the active regions 210 and 220 of the first and second conductivity type MOS transistors of the semiconductor substrate 230, on which the gate insulating layers 310 are formed, for example using a material selected among poly-Si or Si—Ge or Ge.

Nitride layers are further formed on the conductive layers for the gate electrode and are patterned so that hard masks 340 for preventing upper portions of gate electrodes 320 and 330 of the first and second conductivity type MOS transistors from being etched can be formed in a process for forming a recessed region which will be described below. The conductive layers for the gate electrode and the gate insulating layers are etched using the hard masks 340 as etching masks so that the gate electrodes 320 and 330 and the patterned gate insulating layers 310 are formed.

Subsequently, ion implantation is implemented in step S3.

Figure 4A:
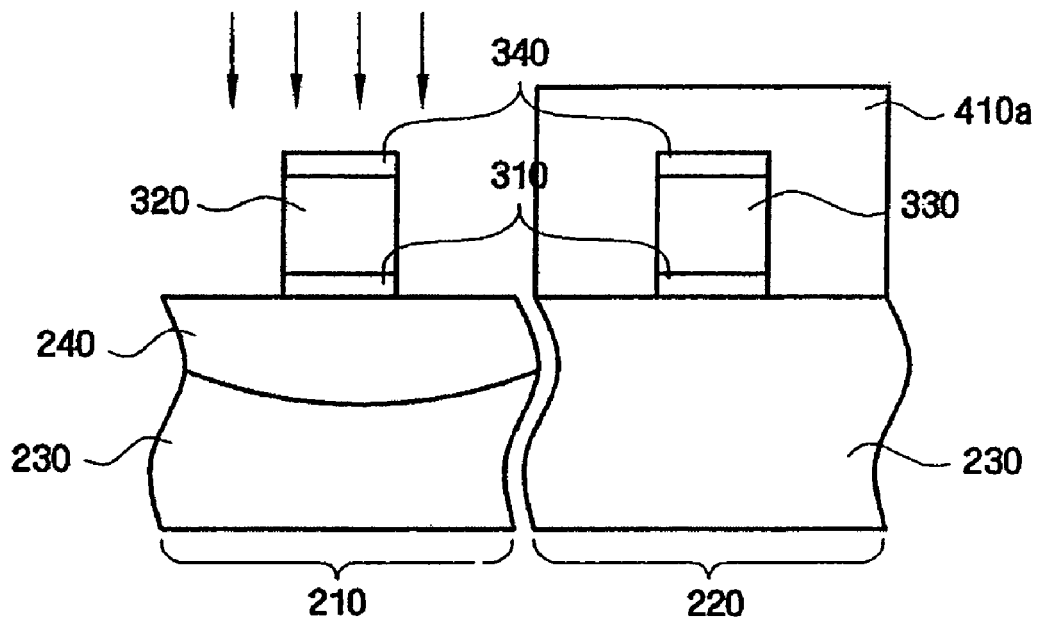

Referring to FIG. 4A, the active region 220 of the second conductivity type MOS transistor is masked by a mask 410a for performing ion implantation into the active region 210 of the first conductivity type MOS transistor. The ion implantation is performed in the active region 210 of the first conductivity type MOS transistor using the gate electrode 320 of the first conductivity type MOS transistor as an ion implantation mask.

Ion implantation is based on first conductivity type impurity ion implantation. Selective halo implantation can also optionally be performed.

The first conductivity type impurity ion implantation is implemented for the purpose of forming an extension region which is lightly doped. In a case where the first conductivity type is n-type, impurity ions used are n-type ions and may comprise As ions, for example. In a case where the first conductivity type is p-type, impurity ions used are p-type ions and may comprise B ions, for example.

Halo implantation refers to a process by which, after forming the gate electrode, opposite type ions to those ions used for forming a source/drain region for increasing concentrations of the active regions of the semiconductor substrate 230 are implanted so as to prevent a punch-through phenomenon from occurring according to reduction in channel length. For the halo implantation, in a case where the first conductivity type is n-type, halo ions used are p-type ions and may comprise B ions, for example. In a case where the first conductivity type is p-type, halo ions used are n-type ions and may comprise As ions, for example.

Figure 4B:
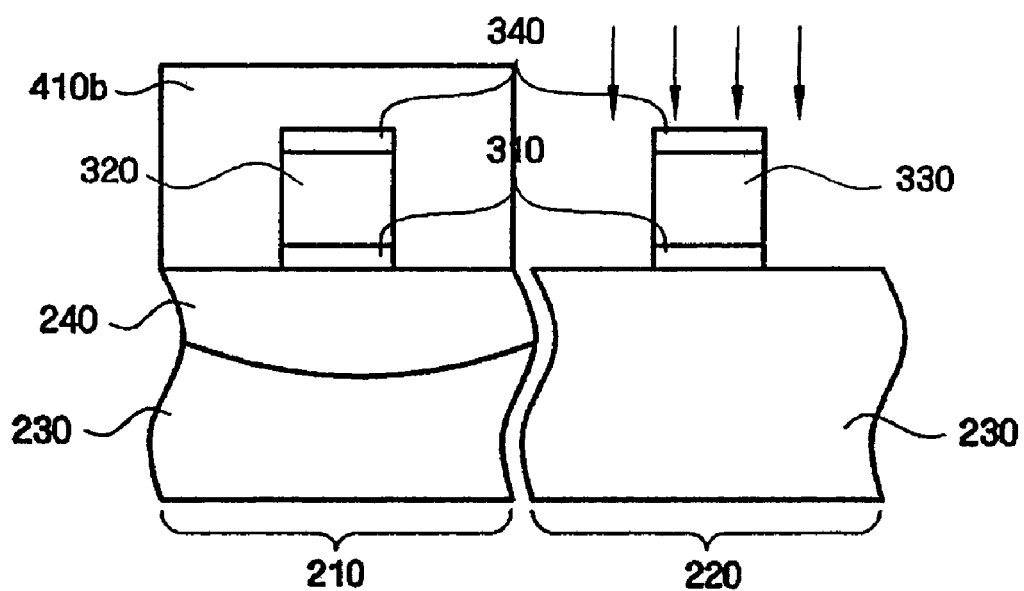

Further, referring to FIG. 4B, the active region 210 of the first conductivity type MOS transistor is masked by a mask 410b for implementing a ion-implantation into the active region 220 of the second conductivity type MOS transistor. The ion-implantation is performed on the active region 220 of the second conductivity type MOS transistor using the gate electrode 330 of the second conductivity type MOS transistor as an ion implantation mask. This ion implantation is based on amorphous ion implantation and second conductivity type impurity ion implantation and halo implantation can be implemented selectively.

The amorphous ions amorphize the active region, on which the source/drain region will be formed, thereby preventing impurities in the source/drain from being diffused into a channel layer. Further, the amorphous ions are used to perform a subsequent selective recess process by generating defects in the active region. Examples of the amorphous ions include Ge, Si, P or In, or the like; Ge is preferable. Further, it is preferable that the amorphous ions are implanted at an ion implantation energy of 5-50 keV, at an ion implantation amount of 1E14-1E16 and at an ion implantation angle of 0-90°.

The second conductivity type impurity ion implantation is implemented for the purpose of forming an extension region which is lightly doped. In a case where the second conductivity type is n-type, impurity ions used are n-type ions and may comprise As ions, for example. In a case where the second conductivity type is p-type, impurity ions used are p-type ions and may comprise B ions, for example.

For the halo implantation, in a case where the second conductivity type is n-type, halo ions used are p-type ions and may comprise B ions, for example. In a case where the second conductivity type is p-type, halo ions used are n-type ions and may comprise As ions, for example.

Subsequently, spacers are formed in sidewalls of the gate electrodes 320 and 330 of the first and second conductivity type MOS transistors in step S4.

Figure 5:
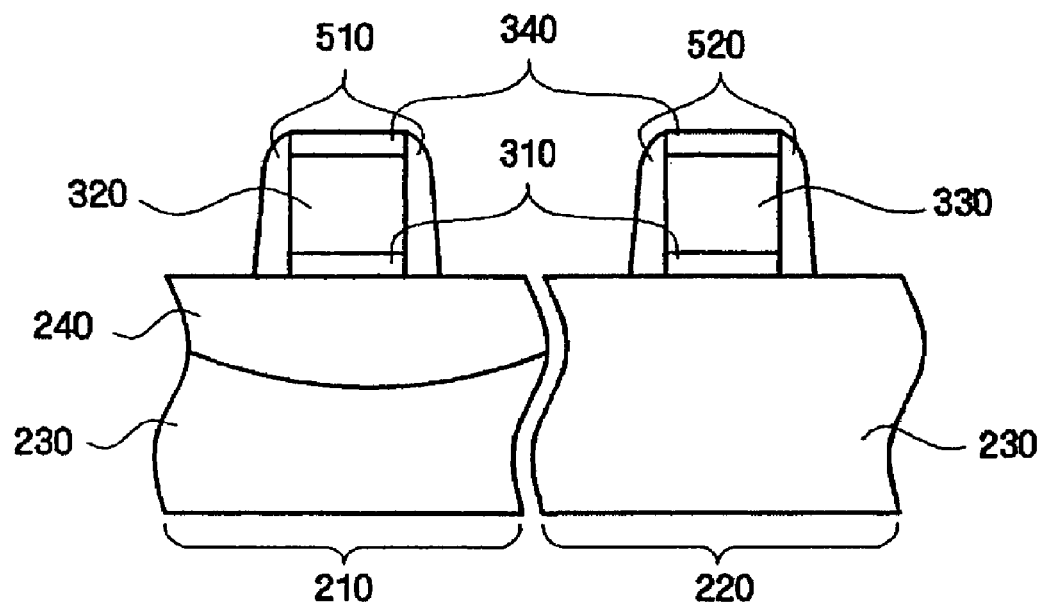

Referring to FIG. 5, an insulating layer for the spacer, for example, an oxide layer, is provided on the entire resulting surface of the semiconductor substrate 230 including the gate electrodes 320 and 330 of the first and second conductivity type MOS transistors and then is processed using an etch-back process having an anisotropic etching characteristic, thereby forming spacers 510 and 520 on both side walls of the gate electrodes 320 and 330.

Subsequently, a selective recessed region is formed in step S5.

Figure 6:
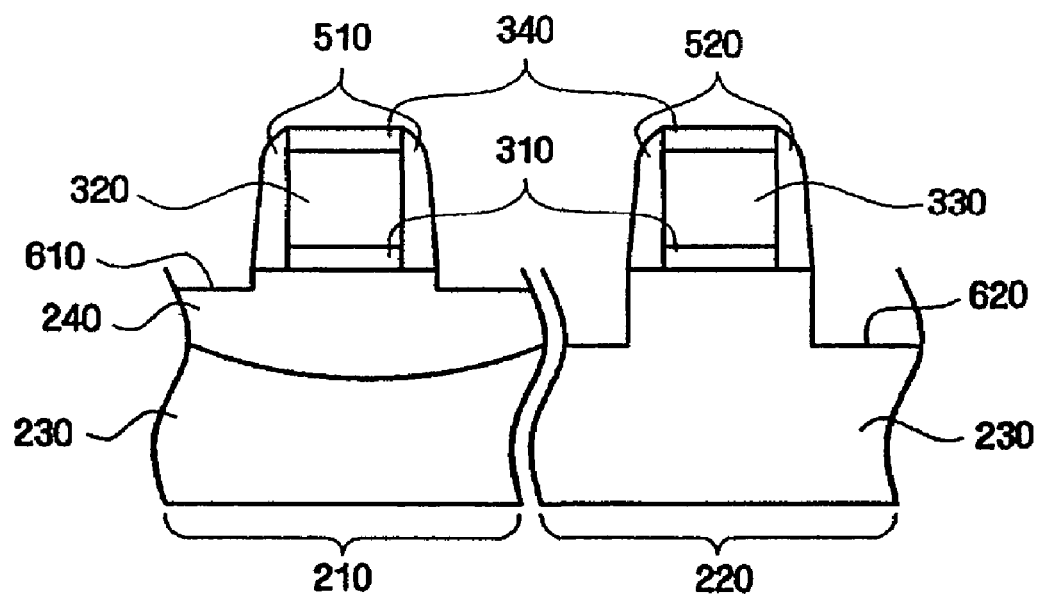

Referring to FIG. 6, the active regions 210 and 220 exposed by the gate electrodes 320 and 330 of the first and second conductivity type MOS transistors and the spacers 510 and 520 are etched to form recessed regions. A first recessed region 610 of a first depth is formed in the active region 210 of the first conductivity type MOS transistor and a second recessed region 620 of a second depth deeper than the first depth is formed in the active region 220 of the second conductivity type MOS transistor.

Since only the active region 220 of the second conductivity type MOS transistor is amorphized by the amorphous ions so that defects occur in only an amorphous portion, the selective etching as described above may be achieved by using an etching gas capable of selectively etching only the amorphous portion. A halogenized gas can be used as the selective etching gas. It is preferable that HCl gas diluted with hydrogen is used as the halogenized gas.

For example, the selective etching process can be performed under the following conditions: a flow rate of HCl/H$_2$ gas is 0.1-10; temperature is 600-800 C; pressure is 5-760 torr; flow velocity of HCl is 0-15,000 sccm; and flow velocity of H$_2$ is 0.5-35 sccm. Further, if an amount of GeH$_4$ gas is used of an amount not more than the amount of HCl used, the selective etching has a greater effect.

In a case where the selective etching is performed as described above, the active region exposed by the gate electrode 330 of the second conductivity type MOS transistor, which is the amorphous portion amorphized by the amorphous ions, and the spacer 520 are etched about 2 to 5 times more rapidly than the active region exposed by the gate electrode 320 of the first conductivity type MOS transistor and the spacer 510. Thus, as shown in FIG. 6, the first recessed region 610 of the first depth is formed in the active region 210 of the first conductivity type MOS transistor and the second recessed region 620 of the second depth deeper than the first depth is formed in the active region 220 of the second conductivity type MOS transistor.

At this time, it is preferable that a depth ratio of the first recessed region 610 to the second recessed region 620 is on the order of 1-50:10-200.

A selective epitaxial layer is next formed in step S6.

Figure 7:
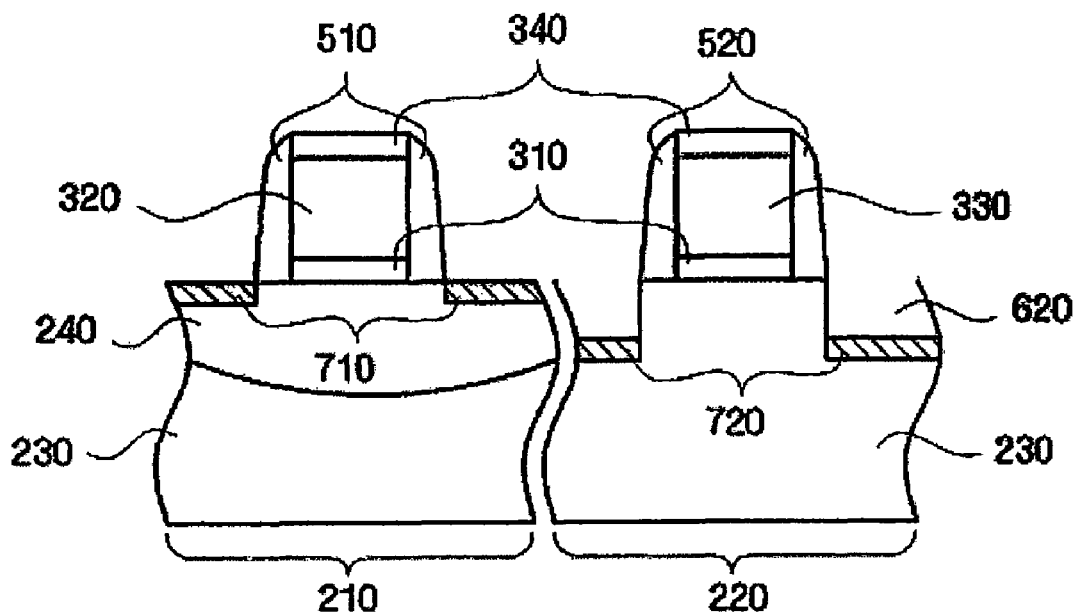
Figure 8:
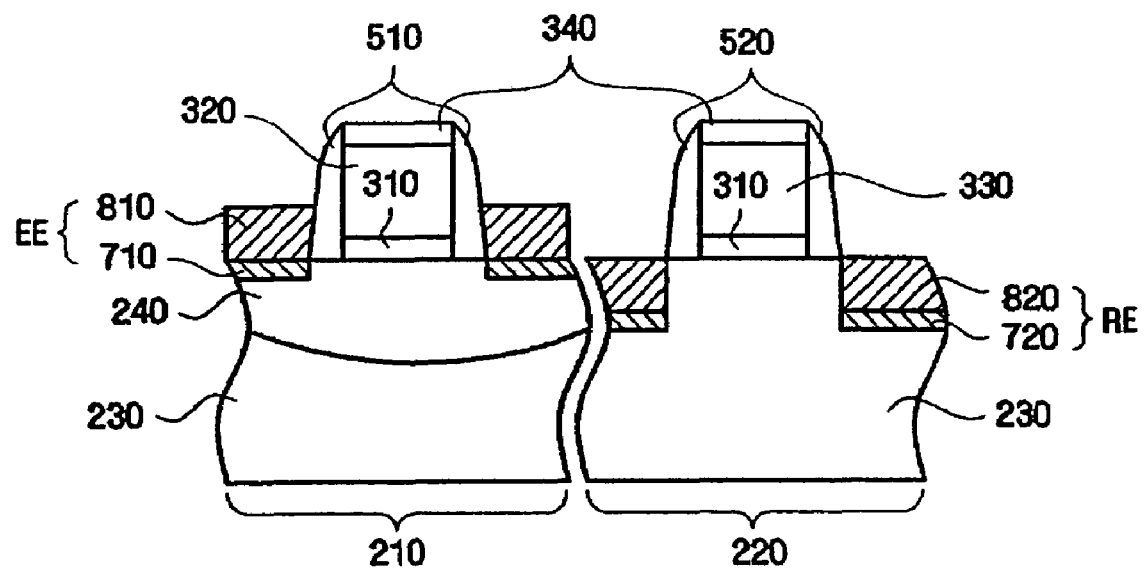

Referring to FIGS. 7 and 8, selective epitaxial growth (SEG) is carried out over the first and second recessed regions 610 and 620 of the first and second conductivity type MOS transistors so that an elevated epitaxial layer (hereinafter, referred to as EE), which fills the first recessed region 610 and is elevated above the level of the semiconductor substrate, and a recessed epitaxial layer (hereinafter, referred to as RE), which fills the second recessed region 620, can later be formed.

The selective epitaxial growth is carried out over only the active region and is not carried out over the field isolation region. The field isolation region is generally formed of field oxide or nitride and the active region is generally formed of Si.

The selective epitaxial growth can be carried out using chemical vapor deposition (CVD), reduced pressure CVD (RPCVD) or ultra high vacuum CVD, however is not limited thereto.

Referring to FIG. 7, the first and second recessed regions 610 and 620 of the first and second conductivity type MOS transistors are grown using selective-epitaxial growth using a semiconductor material, or a semiconductor material containing an additive, and then are filled to a depth corresponding to the first depth. Such layers of the first and second recessed regions 610 and 620 are referred to as first epitaxial layers 710 and 720. In one example, the semiconductor material of the first epitaxial layers 710 and 720 is Si. The additive refers to a material having a lattice constant different from that of the semiconductor material, that is, a lattice constant larger or smaller than that of the semiconductor material and, for example, can comprise Ge or C.

Subsequently, as shown in FIG. 8, second epitaxial layers 810 and 820 having a thickness of a depth that is about equal to the second depth minus the first depth are formed on the first epitaxial layers 710 and 720 of the first and second conductivity type MOS transistors.

At this time, it is preferable that the second epitaxial layers 810 and 820 are formed in-situ on the first epitaxial layers 710 and 720.

In this case, the second epitaxial layer 810 of the first conductivity type MOS transistor is elevated to a height that is above the upper surface of the semiconductor substrate 230 and the second epitaxial layer 820 of the second conductivity type MOS transistor is at a height that is about even with the surface of the semiconductor substrate 230.

The semiconductor material of the second epitaxial layers 810 and 820 comprises, for example, Si. The additive refers to a material having a lattice constant different from the semiconductor material, that is, a lattice constant larger or smaller than that of the semiconductor material, and may, for example, comprise Ge or C.

The first epitaxial layers 710 and 720 are formed of the semiconductor material or of the semiconductor material containing an additive that is different from the material and/or additive of the second epitaxial layers 810 and 820. That is, for example, if the first epitaxial layers 710 and 720 are formed of Si or SiC, the second epitaxial layers 810 and 820 are formed of SiGe. On the contrary, if the first epitaxial layers 710 and 720 are formed of SiGe, the second epitaxial layers 810 and 820 are formed of Si or SiC.

At this time, it is preferable that the additive Ge or C included in the first epitaxial layers 710 and 720 or the second epitaxial layers 810 and 820 have a content of about 5-50% by weight and less than 5% by weight, respectively.

In Si, Ge or C making up the epitaxial layer as described above, $Si_2H_6$, $SiH_4$, $SiH_2Cl_2$, $SiHCl_3$, $SiCl_4$, and the like, can be used as a source of Si; $GeH_4$ and the like can be used as a source of Ge; and $C_2H_6$, $CH_3SiH_3$, and the like, can be used as a source of C. Further, a gas such as HCl or $Cl_2$ is added in order to improve the selective growth characteristic of the epitaxial layer. Also, a gas such as $B_2H_6$, $PH_3$, or $AsH_3$ can be specially added for the purpose of doping. If HCl is added, the epitaxial layer is not formed in the field isolation region formed of field oxide or nitride but is formed in only a region where Si is exposed, thereby making it possible to perform the selective epitaxial growth.

One example of process conditions in Epi-Cetura equipment made from Applied Materials Co. Ltd. for forming the elevated epitaxial layer (EE) and the recessed epitaxial layer (RE) in the first and second recessed regions 610 and 620 using Si, SiGe and SiC, and the like, by a selective epitaxial growth process, is described in the following Table 1.

TABLE 1

|  | Si | SiGe | SiC |
|---|---|---|---|
| Temperature (C.) | 700-900 | 500-750 | 650-850 |
| Pressure (Torr) | 10-20 | 10-20 | 10-20 |
| Flow velocity of $SiH_2Cl_2$ (sccm) | 100-200 | 100-200 | 100-200 |
| Flow velocity of HCl (sccm) | 0-100 | 0-100 | 0-100 |
| Flow velocity of $GeH_4$ (sccm) | — | 50-200 | — |
| Flow velocity of $CH_3SiH_3$ (sccm) | — | — | 5-50 |
| (Selective) Flow velocity of $B2H_6$ (sccm) | 0-100 | 0-100 | 0-100 |
| (Selective) Flow velocity of $PH_3$ (sccm) | 0-100 | 0-100 | 0-100 |
| Flow velocity of $H_2$ carrier gas (sccm) | 10-35 | 10-35 | 10-35 |

Subsequently, first and second conductivity type junction regions are formed in the elevated epitaxial layer and the recessed epitaxial layer, respectively in step S7.

Figure 9A:
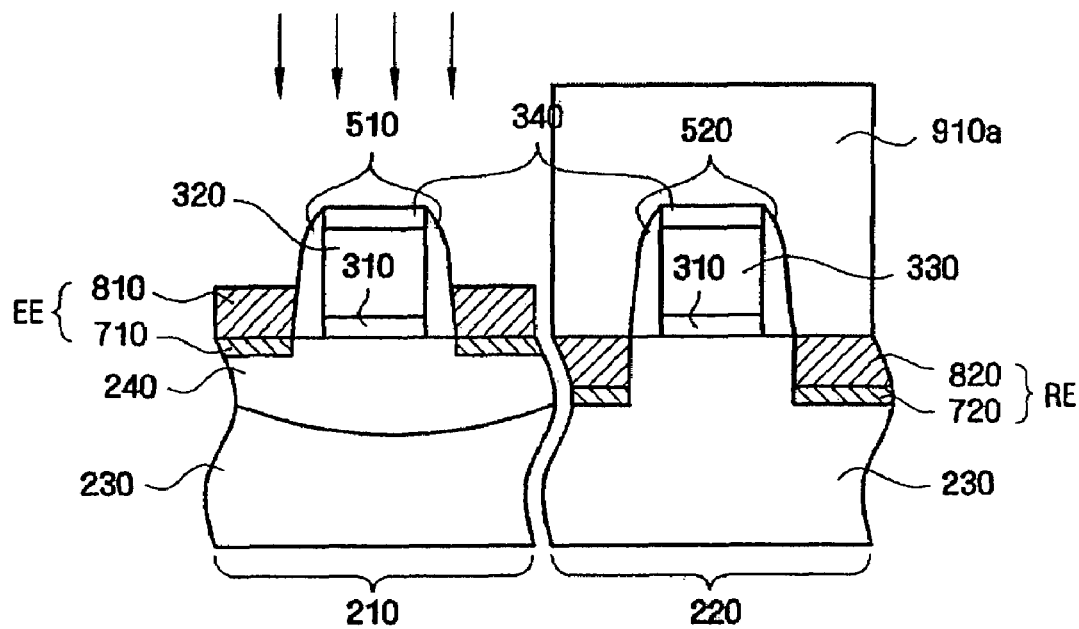
Figure 9B:
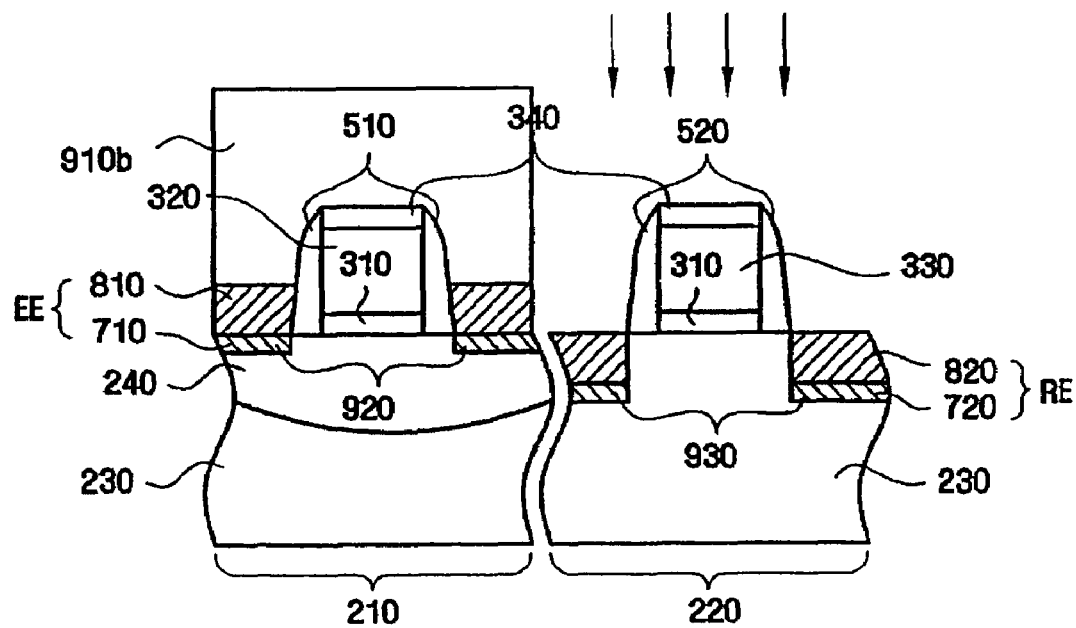

Referring to FIG. 9A, the active region 220 of the second conductivity type MOS transistor is masked by a mask 910a to form a first conductivity type junction region in the active region 210 of the first conductivity type MOS transistor. Then, first conductivity type ions are implanted into the elevated epitaxial layer (EE) of the first conductivity type MOS transistor under predetermined conditions using the gate electrode 320 of the first conductivity type MOS transistor and the spacer 510 as an ion implantation mask. Subsequently, referring to FIG. 9B, the active region 210 of the first conductivity type MOS transistor is masked by a mask 910b to form a second conductivity type junction region in the active region 220 of the second conductivity type MOS transistor. Then, second conductivity type ions are implanted into the recessed epitaxial layer (RE) of the second conductivity type MOS transistor under predetermined conditions using the gate electrode 330 of the second conductivity type MOS transistor and the spacer 520 as an ion implantation mask. Thus, source/drain regions 920 and 930 of the first and second conductivity type MOS transistors are formed.

Here, in a case where the first conductivity type is n-type and the second conductivity type is p-type, the first conductivity type ion may comprise As ions and the second conductivity type ion may comprise B ions. Further, in a case where the first conductivity type is p-type and the second conductivity type is n-type, the first conductivity type ion may be B and the second conductivity type ion may be As.

Subsequently, a silicide layer for making up a contact is formed in step S8.

In a case where the silicide layers are to be formed on upper parts of the gate electrodes 320 and 330, the hard masks 340 are removed prior to forming the silicide layer. Then, silicide layers 1010 are formed on the gate electrodes 320 and 330 and the source/drain regions 920 and 930 by a general process for forming the silicide layer.

Particularly, in a case where the second epitaxial layers 810 and 820 of the first and second conductivity type MOS transistors are formed, SiGe, Ni, Pt, Ni—Pt, Ni—Ti, and the like, can be used to form the silicide layer 1010. In a case where Ni is used to form the silicide layer 1010 as described above, resistance of an N+ contact can be reduced by 30% or more compared to a case of forming the silicide layer on a Si substrate using Ni.

Figure 10:
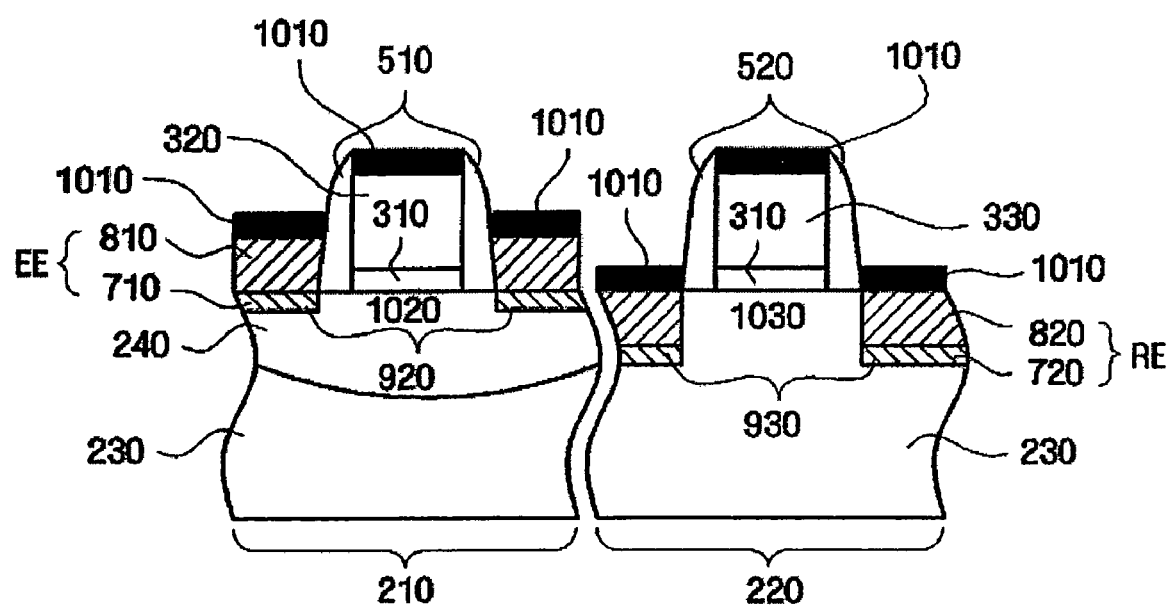

The CMOS transistor according one embodiment of the present invention, as shown in FIG. 10, includes the first conductivity type MOS transistor having the elevated source/drain region and the second conductivity type MOS transistor having the recessed source/drain region.

The elevated source/drain region 920 is located at both sides of the gate electrode 320 of the first conductivity type MOS transistor. The elevated shape is referred to as a shape that rises above, or is elevated above, an upper surface of the semiconductor substrate 230.

The elevated source/drain region 920 abuts a channel region 1020 within the semiconductor substrate 230 below the lower part of the gate insulating layer 310 and is comprised of the first epitaxial layer 710 formed within the semiconductor substrate 230 and the second epitaxial layer 810 which is formed on an upper part of the first epitaxial layer 710 and is elevated above an upper surface of the semiconductor substrate 230.

The recessed source/drain region 930 is located at both sides of the gate electrode 330 of the second conductivity type MoS transistor. The recessed shape is referred to as a shape that is recessed into the body of the semiconductor substrate 230.

The recessed source/drain region 930 abuts a channel region 1030 within the semiconductor substrate 230 below the lower part of the gate insulating layer 310 and is comprised of the second epitaxial layer 820 formed within the semiconductor substrate 230 and the first epitaxial layer 720 formed on a lower part of the second epitaxial layer 820.

The first epitaxial layers 710 and 720 are formed of a semiconductor material or a semiconductor material containing an additive that is different from those making up the second epitaxial layers 810 and 820. In one example, the semiconductor material comprises Si. The additive refers to a material having a lattice constant different from the semiconductor material, that is, a lattice constant larger or smaller than that of the semiconductor material and may, for example, comprise Ge or C.

That is, in one example, if the first epitaxial layers 710 and 720 are formed of Si or SiC, the second epitaxial layers 810 and 820 are formed of SiGe. On the contrary, if the first epitaxial layers 710 and 720 are formed of SiGe, the second epitaxial layers 810 and 820 are formed of Si or SiC.

As one example of the CMOS transistor according to the present invention, a CMOS transistor is provided, in which the first conductivity type is n-type and the second conductivity type is p-type, so that the first epitaxial layers 710 and 720 are formed of Si or SiC and the second epitaxial layers 810 and 820 are formed of SiGe. In this case, performance of the CMOS transistor can be improved.

The Si or SiC material comprising the first epitaxial layers 710 formed adjacent to the channel region 1020 of the first conductivity type (n-type) MOS transistor has the same lattice structure as the Si material of the semiconductor substrate 230, but with a lattice constant equal to or smaller than that of Si. Thus, a tensile stress is applied to the channel region 1020 of the first conductivity type (n-type) MOS transistor so that effective mass in the channel region 1020 is reduced and electron mobility is increased in turn. Further, the SiGe material comprising the second epitaxial layers 820 formed adjacent to the channel region 1030 of the second conductivity type (p-type) MOS transistor has the same lattice structure as the Si material of the semiconductor substrate 230, but with a lattice constant larger than that of Si. Thus, a compressive stress is applied to the channel region 1030 of the second conductivity type (p-type) MOS transistor so that effective mass in the channel region 1030 is increased and hole mobility is improved in turn.

As another example of the CMOS transistor according to the present invention, a CMOS transistor is given, in which the first conductivity type is p-type and the second conductivity type is n-type, so that the first epitaxial layers 710 and 720 are formed of SiGe and the second epitaxial layers 810 and 820 are formed of Si or SiC.

The SiGe material comprising the first epitaxial layers 710 formed adjacent to the channel region 1020 of the first conductivity type (p-type) MOS transistor has the same lattice structure as the Si material of the semiconductor substrate 230, but with a lattice constant larger than that of Si. Thus, a compressive stress is applied to the channel region 1020 of the first conductivity type (p-type) MOS transistor so that effective mass in the channel region 1020 is increased and hole mobility is increased in turn. Further, the Si or SiC material comprising the second epitaxial layers 820 formed adjacent to the channel region 1030 of the second conductivity type (n-type) MOS transistor has the same lattice structure as the Si material of the semiconductor substrate 230, but with a lattice constant equal to or smaller than that of Si. Thus, a tensile stress is applied to the channel region 1030 of the second conductivity type (n-type) MOS transistor so that effective mass in the channel region 1030 is reduced and electron mobility is improved in turn.

While this invention has been particularly shown and described with references to preferred embodiments thereof, it will be understood by those skilled in the art that various changes in form and details may be made herein without departing from the spirit and scope of the invention as defined by the appended claims.

As described above, a method of fabricating a CMOS transistor according to the present invention and a CMOS transistor fabricated by the method have one or more advantageous effects, which will be described below.

First, in a case where the CMOS transistor is fabricated by the method of fabricating the CMOS transistor according to the present invention, it is possible to perform selective etching for simultaneously forming first and second recessed regions without the need for a separate mask process for amorphizing only a region of one conductivity type out of two regions of different conductivity types on which the MOS transistors are formed.

Second, an elevated epitaxial layer and a recessed epitaxial layer are formed in the first and second recessed regions formed as described above using materials having different lattice constants so that stresses of opposite directions are applied to channel regions of first and second conductivity type MOS transistors, thereby modifying the channel regions. As a result, electron or hole mobility is improved so that characteristics of both the first and second conductivity type MOS transistors can be simultaneously improved.

What is claimed is:

1. A method of fabricating a CMOS transistor comprising:
   (a) providing a semiconductor substrate including active regions of first and second conductivity type MOS transistors respectively;
   (b) respectively forming gate insulating layers and gate electrodes of the first and second conductivity type MOS transistors on each of the active regions;
   (c) implanting first conductivity type impurity ions into the active region of the first conductivity type MOS transistor using the gate electrode of the first conductivity type MOS transistor as an ion implantation mask, and implanting second conductivity type impurity ions and amorphous ions into the active region of the second conductivity type MOS transistor using the gate electrode of the second conductivity type MOS transistor as an ion implantation mask to amorphize the active region of the second conductivity type MOS transistor;
   (d) forming spacers at sidewalls of the gate electrodes;
   (e) etching the active regions exposed by the gate electrodes and the spacers to form a first recessed region of a first depth in the active region of the first conductivity type MOS transistor and a second recessed region of a second depth in the active region of the second conductivity type MOS transistor, the second depth being greater than the first depth;
   (f) performing selective epitaxial growth on the first and second recessed regions to form an elevated epitaxial layer filling the first recessed region and extending to a level above an upper surface of the semiconductor substrate and to form a recessed epitaxial layer that fills the second recessed region; and
   (g) respectively forming first and second conductivity type junction regions in the elevated epitaxial layer and the recessed epitaxial layer.

2. The method of claim 1, wherein the amorphous ions are selected from Ge, Si, P, In, and a combination thereof.

3. The method of claim 2, wherein the amorphous ions are Ge.

4. The method of claim 1, wherein step (c) is performed using an etch gas which can selectively etch the amorphized active region of the second conductivity type MOS transistor, into which the second conductivity type impurity ions are implanted, rather than the active region of the first conductivity type MOS transistor, into which the first conductivity type impurity ions are implanted.

5. The method of claim 4, wherein the etch gas is a halogenized gas.

6. The method of claim 1, wherein in step (c), a depth ratio of the first recessed region to the second recessed region is 1-50 to 10-200.

7. The method of claim 1, wherein the elevated epitaxial layer includes a first epitaxial layer filling the first recessed region and a second epitaxial layer which is formed on the first epitaxial layer and extends above an upper surface of the semiconductor substrate, and wherein the recessed epitaxial layer includes a first epitaxial layer filling a portion of the second recessed region and a second epitaxial layer formed thereon filling a remainder of the recessed region.

8. The method of claim 7, wherein the first epitaxial layers are formed of a semiconductor material or a semiconductor material containing an additive different from those forming the second epitaxial layers.

9. The method of claim 8, wherein the semiconductor material is Si and the additive is a material having a lattice constant different from that of the semiconductor material.

10. The method of claim 9, wherein the additive is Ge or C.

11. The method of claim 7, wherein the first epitaxial layer is formed of Si or SiC and the second epitaxial layer is formed of SiGe.

12. The method of claim 7, wherein the first epitaxial layer is formed of SiGe and the second epitaxial layer is formed of Si or SiC.

13. The method of claim 1, wherein step (b) comprises:
   successively forming the gate insulating layer, a conductive layer for the gate electrode and an insulating layer for a hard mask on the semiconductor substrate;
   patterning the insulating layer to form the hard mask; and
   etching the conductive layer for the gate electrode and the gate insulating layer using the hard mask as an etch mask to form the gate electrodes and the patterned gate insulating layer.

14. The method of claim 1, further comprising prior to step (d), implanting halo ions into the active regions of the first and second conductivity type MOS transistors.

15. The method of claim 1, further comprising after step (g), providing a silicide layer for forming contacts.

16. The method of claim 15, wherein the silicide layer is formed using Ni when the second epitaxial layer is formed of SiGe.

* * * * *